United States Patent
Shen et al.

(10) Patent No.: US 7,181,669 B2
(45) Date of Patent: Feb. 20, 2007

(54) DEVICE AND METHOD FOR BLOCK CODE ERROR CORRECTION

(75) Inventors: Yu-Cheng Shen, Hsinchu (TW); Kuo-Ming Wang, Hsinchu (TW); Pei Yu, Hsinchu (TW); Cheng-Yueh Hsiao, Nantou (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 583 days.

(21) Appl. No.: 10/734,286

(22) Filed: Dec. 15, 2003

(65) Prior Publication Data

US 2004/0249840 A1 Dec. 9, 2004

(30) Foreign Application Priority Data

Jun. 3, 2003 (TW) .............................. 92115136 A

(51) Int. Cl.
*H03M 13/05* (2006.01)
*H03M 13/29* (2006.01)

(52) U.S. Cl. ....................................... 714/755; 714/765
(58) Field of Classification Search ................ 714/755, 714/765
See application file for complete search history.

(56) References Cited

U.S. PATENT DOCUMENTS

| | | | | |
|---|---|---|---|---|
| 4,653,052 A | * | 3/1987 | Doi et al. ..................... | 714/755 |
| 4,719,628 A | * | 1/1988 | Ozaki et al. ................. | 714/755 |
| 5,278,846 A | * | 1/1994 | Okayama et al. ............ | 714/755 |
| 5,371,751 A | * | 12/1994 | Moriyama .................... | 714/762 |
| 5,392,299 A | * | 2/1995 | Rhines et al. ................ | 714/756 |
| 5,696,774 A | * | 12/1997 | Inoue et al. .................. | 714/755 |
| 5,712,861 A | * | 1/1998 | Inoue et al. .................. | 714/752 |
| 5,920,578 A | * | 7/1999 | Zook ............................ | 714/755 |
| 6,122,763 A | * | 9/2000 | Pyndiah et al. .............. | 714/755 |
| 6,292,921 B1 | * | 9/2001 | Daoudi et al. ............... | 714/784 |
| 6,389,573 B1 | * | 5/2002 | Weng ........................... | 714/784 |
| 2004/0088635 A1 | * | 5/2004 | Kravtchenko ................ | 714/758 |

* cited by examiner

*Primary Examiner*—Stephen M. Baker
(74) *Attorney, Agent, or Firm*—Bacon & Thomas, PLLC

(57) ABSTRACT

A device and method for block code error correction. The device includes a block code input unit, an erasing address table, an error table and a decoder. The block code input unit is used to input a block code. The erasing address table and the error table have a plurality of erasing entities and error entities in rows and columns, respectively. The decoder decodes the block code in a row direction based on the erasing address table to find data errors on rows and update the error table, and updates the erasing address table in the row direction according to a first determination principle. Next, the decoder decodes the block code in a column direction based on the erasing address table to find data errors on columns and update the error table, and updates the erasing address table in the column direction according to a second determination principle.

12 Claims, 5 Drawing Sheets

DEVICE AND METHOD FOR BLOCK CODE ERROR CORRECTION

BACKGROUND OF THE INVENTION

1. Field of the Invention

The present invention relates to the technical field of decoders and, more particularly, to a device and method for block code error correction.

2. Description of Related Art

While data is transferring and storing in a DVD system, it is easily damaged by external factors such as scrape or dirty fingerprint on a DVD, access of an equipment misalignment and the like. Many coding techniques have been developed to reduce the possibility of data error. Error Correction Code (ECC) is a generic term for error coding correction, which adds extra redundancy information to original data to form codeword for being written into a storage media subsequently. When reading the codeword stored in the storage media, the most important thing is to convert the codeword back to the original data. Due to the extra redundancy information in the codeword, the reading equipment can understand the original data better and thus obtain higher reliable data after special decoding procedure is performed. It is definite that more redundancy can provide more information to the reading equipment and thus achieve a higher decoding performance. However, this has to sacrifice transmission rate of the data.

The development object of ECC has an important issue on system implementation for a low complicated decoder in addition to assuring accurate data. In general, decoding block code that is relatively easy is commonly employed in dish-shaped storage. In many ECCs, Reed-Solomon codes have the preferred error correction capability, wherein algebraic structure implied in codeword thereof can be implemented in a decoder easily. Because a DVD has a relatively high physical density on the data storage, a DVD system needs an enhanced capability of error correction because more data stored on the DVD is affected in case of damage. In order to obtain a decoder with excellent error correction performance and low complexity, the DVD system typically emploiese Reed-Solomon Product Code (RSPC).

FIG. 1 is a coding block format published by DVD specification. As shown, a data frame is a matrix with a width of 12 bytes and a length of 172 bytes, and an error correction code (ECC) block is a matrix with a width of 208 bytes and a length of 182 bytes, which is formed by superimposing 16 data frames plus corresponding redundancy blocks.

RSPC coding firstly encodes a matrix in column direction. Each byte of a column is regarded as an element of $2^8$ Galois Field (GF) and thus the column can be represented by a polynomial $D_{col}(x)$ in GF. The column redundancy is generated based on the following equation:

$$R_{col}(x) = \{D_{col}(x) \cdot x^{16}\} \bmod \{G_{col}(x)\},$$

where $$G_{col}(x) = \prod_{k=0}^{15}(x+a^k)$$

and $\alpha$ is GF primitive element derived by $P(x)=x^8+x^4+x^3+x^2+1$.

Obviously, $R_{col}(x)$ is a 16-th order polynomial. Redundancy for each column can be obtained from the coefficients of $R_{col}(x)$ and is regarded as 16-byte data. Each column redundancy is also referred to as a column parity. After the aforementioned procedure is applied to each column, the redundancy corresponding to each column is obtained, which is indicated by PO in the coding block of FIG. 1.

After all column parities are generated, redundancy $R_{row}(x)$ for each row is subsequently determined. Each byte of a row is regarded as an element of $2^8$ Galois Field (GF) and thus the row can be represented by a polynomial $R_{row}(x)$ in GF. The row redundancy is generated based on the following equation:

$$R_{row}(x)=\{D_{row}(x) \cdot x^{10}\} \bmod \{G_{row}(x)\},$$

where $$G_{row}(x) = \prod_{k=0}^{9}(x+a^k);$$

$R_{row}(x)$ is a 10-th order polynomial. Redundancy for each row can be obtained from the coefficients of $R_{row}(x)$ and is regarded as 10-byte data. Each row redundancy is referred to as a row parity. After the aforementioned procedure is applied to each row, the redundancy corresponding to each row is obtained, which is indicated by PI in the coding block of FIG. 1.

Decoding sequence is opposite to the aforementioned coding sequence. Firstly, the row parities are used to decode corresponding rows. Secondly, the column parities are used to decode corresponding columns. Row coding/decoding blocks closer to communication media are referred to as inner codes and their parities are referred to as inner parity (PI) each. By contrast, column coding/decoding blocks are referred to as outer codes and their parities are referred to as outer parity (PO) each.

Erasing addresses can provide more information to a decoder to thus enhance decoding capability. For a DVD system, the encoded codeword is converted by a modulating device from one byte to two bytes, i.e., Eight-to-Sixteen Modulation (ESM). The two bytes are stored in a storage media again. When reading bytes stored in the storage media, a corresponding demodulator is applied. Once the bytes to be read cannot be demodulated properly, it indicates that wrong data is possibly recorded in the corresponding address. In this case, the byte's address is set as an erasing address so that the decoder only needs to compute the address's deviation for error correction while the byte is wrong. Theoretically, the decoder knowing the erasing address can have error correction capability twice than that not knowing the erasing address.

As aforementioned, Reed-Solomon Product Code (RSPC) employed by DVD systems generates parities for columns and rows of a 2D matrix. On decoding, an iterative method is frequently used to increase error correction capability. FIG. 2 is a decoding flowchart using a typical iterative method. As shown in FIG. 2, firstly, row decoding is performed. When a row is properly decoded, all erasing addresses of the row are eliminated; otherwise the erasing addresses of the row are remained to be corrected by next column decoding. Secondly, column decoding is performed. When a column is properly decoded, all erasing addresses of the column are eliminated; otherwise the erasing addresses of the column still are remained to be corrected by next row decoding. The aforementioned procedure is repeated until parity check is all right; i.e., decoding is successful. If iteration is met but error correction is not complete, it means that the decoding is failed. Such a decoding is proportional to memory access number, repeat number of decoding iteration, and power consumption; i.e., higher iteration number will consume more power. Therefore, it is desirable to provide an improved device and method to mitigate and/or obviate the aforementioned problems.

SUMMARY OF THE INVENTION

The object of the present invention is to provide a device and method for block code error correction, so as to overcome the problem in decoding success or failure is determined in higher iteration number, thereby reducing power consumption of decoder and related circuits and memory access number.

According to a feature of the present invention, there is provided a method for block code error correction. The block code includes a plurality of data entities in rows and columns. The block code corresponds to an erasing address table and an error table. The erasing address table has a plurality of erasing entities in rows and columns. The error table has a plurality of error entities in rows and columns. The method includes the steps of: inputting a block code and initializing an erasing address table corresponding to the block code; decoding the block code in row direction based on the erasing address table in order to find data errors on rows and accordingly update an error table corresponding to the block code; updating the erasing address table in row direction according to a first determination principle; decoding the block code in column direction based on the erasing address table in order to find data errors on columns and accordingly update the error table; and updating the erasing address table in column direction according to a second determination principle.

According to another feature of the present invention, there is provided a device for block code error correction. The block code includes a plurality of data entities in rows and columns. The device includes a block code input unit, an erasing address table, an error table and a decoder. The block code input unit is used to input a block code. The erasing address table has a plurality of erasing entities in rows and columns, respectively corresponding to the plurality of data entities of the block code. The error table has a plurality of error entities in rows and columns, respectively corresponding to the plurality of data entities of the block code. The decoder decodes the block code in a row direction based on the erasing address table in order to find data errors on rows and accordingly updates the error table, and updates the erasing address table in the row direction according to a first determination principle. Next, the decoder decodes the block code in a column direction based on the erasing address table in order to find data errors on columns and accordingly updates the error table, and updates the erasing address table in the column direction according to a second determination principle.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
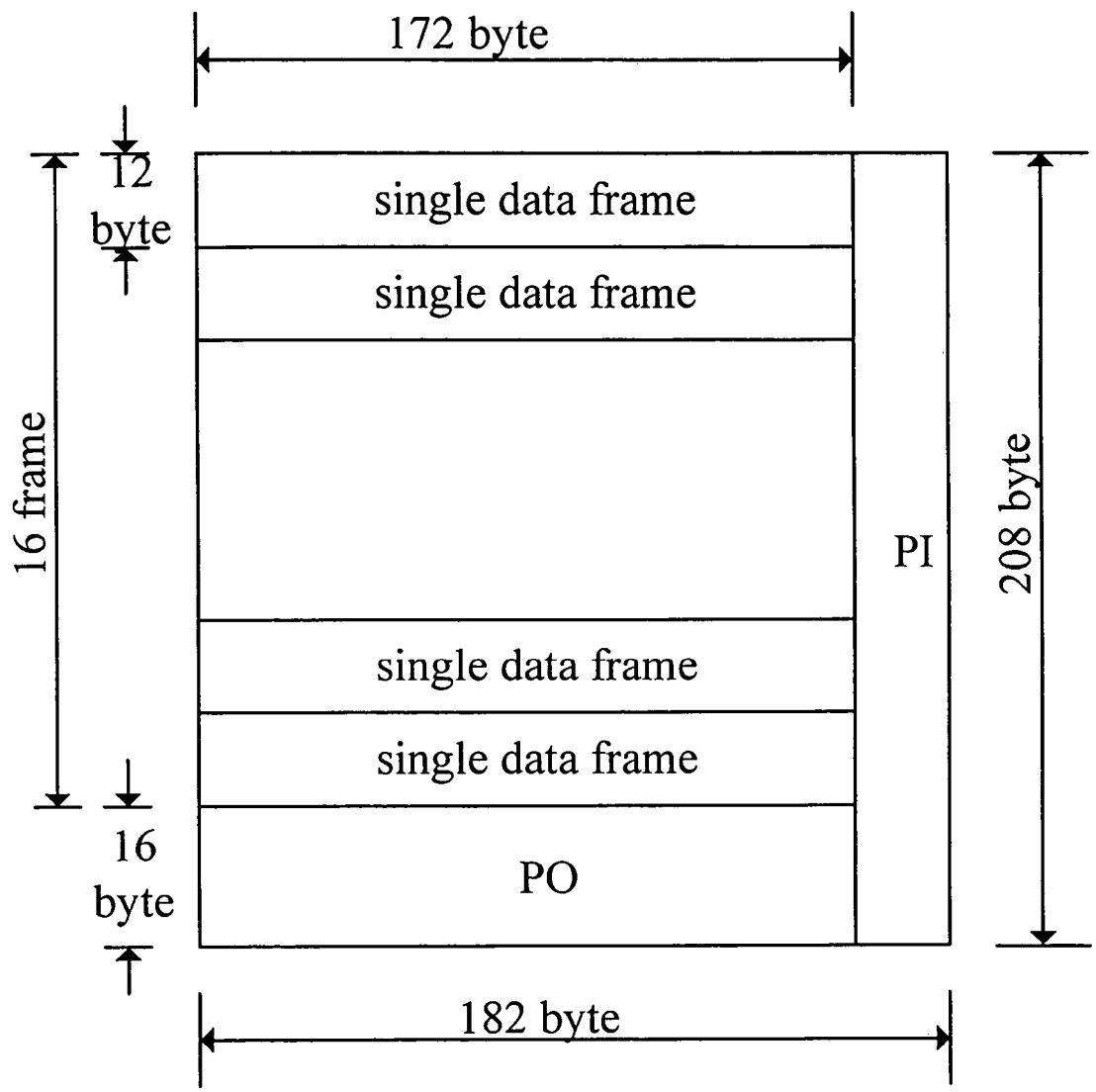
FIG. 1 is a schematic diagram of a coding block format published by DVD specification.
Figure 2:
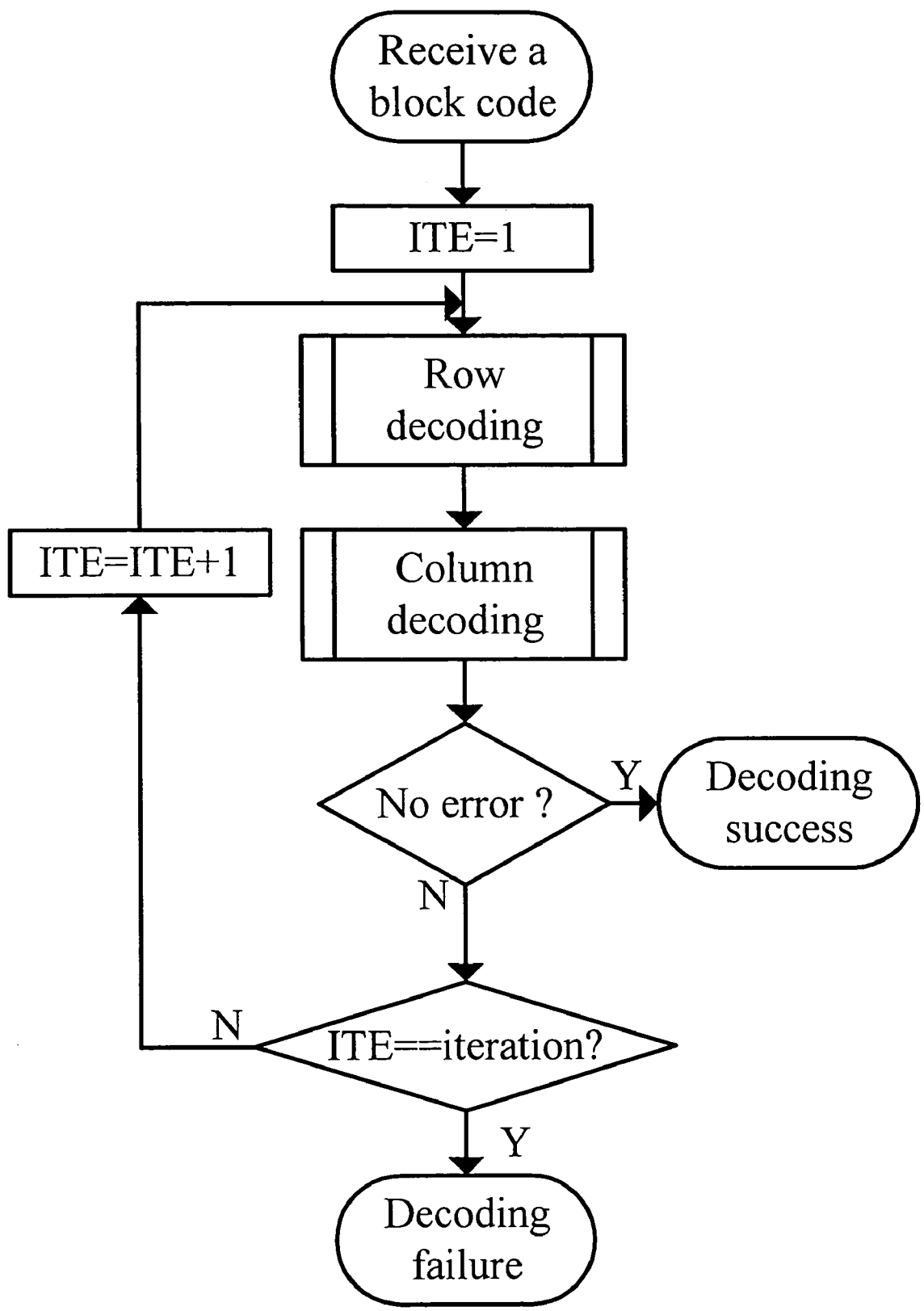
FIG. 2 is a decoding flowchart using a typical iterative method.
Figure 3:
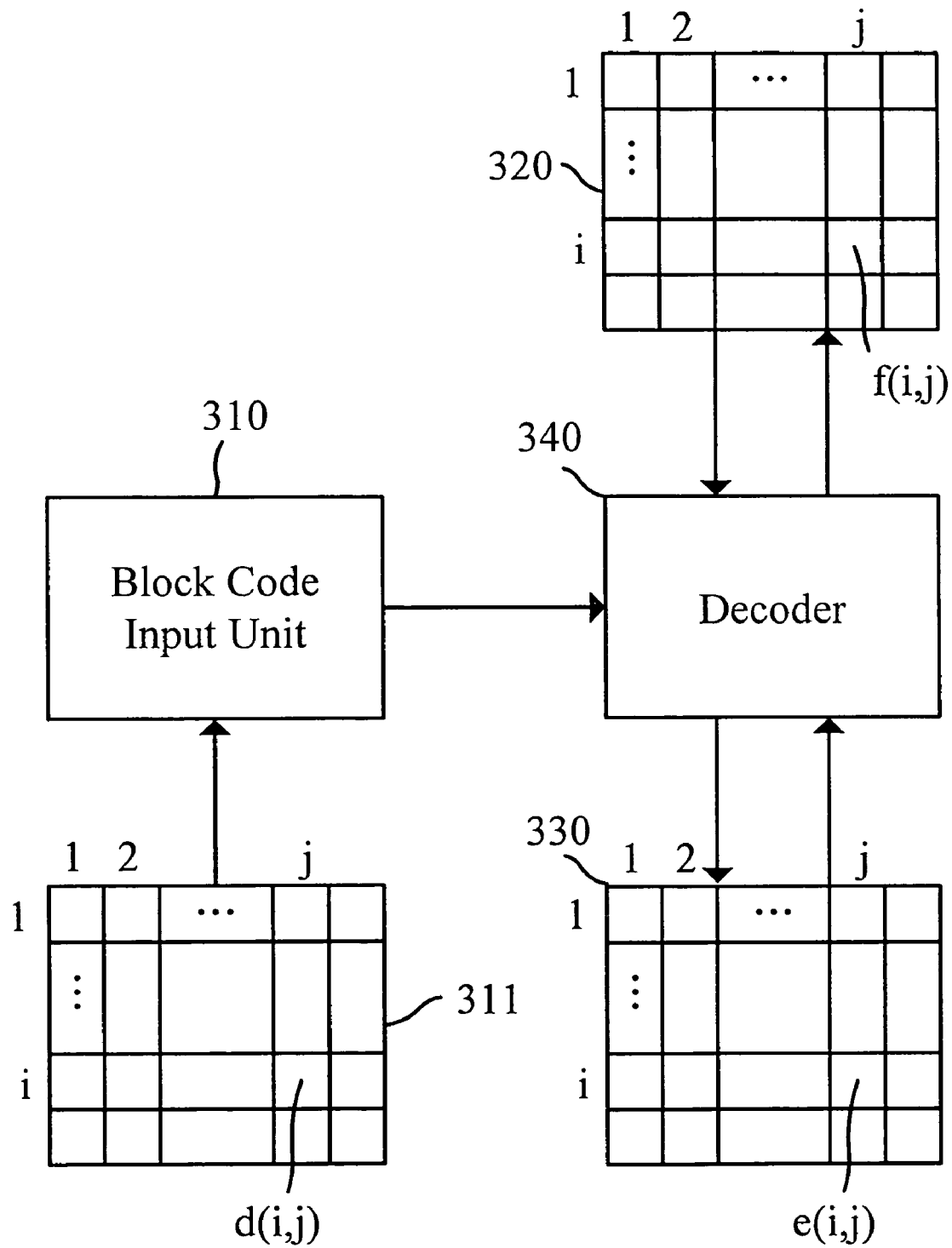
FIG. 3 is a block diagram of a device for block code error correction in accordance with the invention.

With reference to FIG. 3, there is shown a block diagram of a device for block code error correction in accordance with the invention. As shown, the device includes a block code input unit 310, an erasing address table 320, an error table 330 and a decoder 340. The block code input unit 310 is used to input a block code 311. The block code 311 includes a plurality of data entities d(i,j) in rows and columns. The erasing address table 320 has a plurality of erasing entities f(i,j) in rows and columns, respectively corresponding to the plurality of data entities d(i,j). The error table 330 has a plurality of error entities e(i,j) in rows and columns, respectively corresponding to the plurality of data entities d(i,j). The decoder 340 decodes the block code in the row direction based on the erasing address table 320 in order to find data errors on rows and accordingly update the error table 330.

The error table 330 and the erasing address table 320 are defined by the following equations (1) and (2) respectively:

$$e(i,j): Z_{208}^+ \times Z_{182}^+ \to GF(2^8), \qquad (1)$$

$$f(i,j): Z_{208}^+ \times Z_{182}^+ \to \{0,1\} \in Z, \qquad (2)$$

where e is error value obtained by decoding through the decoder 340, which is an element of $2^8$ Galois Field (GF); f is used to record an erasing value. When f is equal to 1, it indicates that the corresponding address is an erasing address. When f is equal to 0, the corresponding address is not an erasing address.

The decoder 340 firstly decodes the block code in row direction. When a row is properly decoded, all erasing addresses in the erasing address table 320 corresponding to the row are eliminated. On the contrary, when a row cannot properly be decoded, the error table 330 and a first determination principle are used to determine whether the erasing address corresponding to the row is remained or not. Thus, it is further determined whether the decodes 340 can perform column decoding by using information provided by the erasing address or not. Next, the decoder 340 decodes the block code in column direction based on the updated erasing address table 320. When a column is properly decoded, all erasing addresses in the erasing address table 320 corresponding to the column are eliminated. On the contrary, when a column cannot properly be decoded, the error table 330 and a second determination principle are used to determine whether an erasing address corresponding to the column is remained or not. Thus, it is further determined whether the decoders 340 can perform next row decoding by using information provided by the erasing address or not. As such, performance of the decoder 340 is increased.

The first determination principle and the second determination principle are dependent on the iteration number (ITE variable) in addition to their decoding directions. Equation (3) represents the first determination principle for erasing address update on row decoding while equation (4) represents the second determination principle for erasing address update on column decoding:

$$f(i,j)=u(g_i(e,f)-T_R), \quad (3)$$

$$f(i,j)=u(h_j(e,f)-T_C), \quad (4)$$

where i is row number, j is column number, both $g_i$ and $h_j$ vary with iteration number, $$u(x) = \begin{cases} 0 & x < 0 \\ 1 & x \geq 0 \end{cases},$$

$$g_i(e,f)=2e(i,:)+f(i,:), \quad h_j(e,f)=2e(:,j)+f(:,j),$$

$$e(i,:) = \sum_{j=1}^{182} \chi(e(i,j)),$$

$$f(i,:) = \sum_{j=1}^{182} f(i,j),$$

$$e(:,j) = \sum_{i=1}^{208} \chi(e(i,j)),$$

$$f(:,j) = \sum_{i=1}^{208} f(i,j),$$

$$\chi(x) = \begin{cases} 0 & x = 0 \\ 1 & x \neq 0 \end{cases},$$

and parameters $T_R$, $T_C$ are a function of iteration number. Different $T_R$, $T_C$ values will result in significant difference in performances on the same decoder. Equation (3) means that all erasing addresses of the erasing address table 320 corresponding to a row not decoded properly are remained as $g_i(e,f) > T_R$. Equation (4) means that all erasing addresses of the erasing address table 320 corresponding to a column not decoded properly are remained as $h_j(e,f) > T_C$. As such, best performance sets of ($T_R$, $T_C$) for different iteration numbers are listed in table 1:

TABLE 1

| ITE = | 1 | 2 | 3 | 4 | 5 |
|---|---|---|---|---|---|
| $T_R$ | 6 | 9 | 10 | 10 | 10 |
| $T_C$ | 12 | 15 | 16 | 16 | 16 |

Figure 4A:
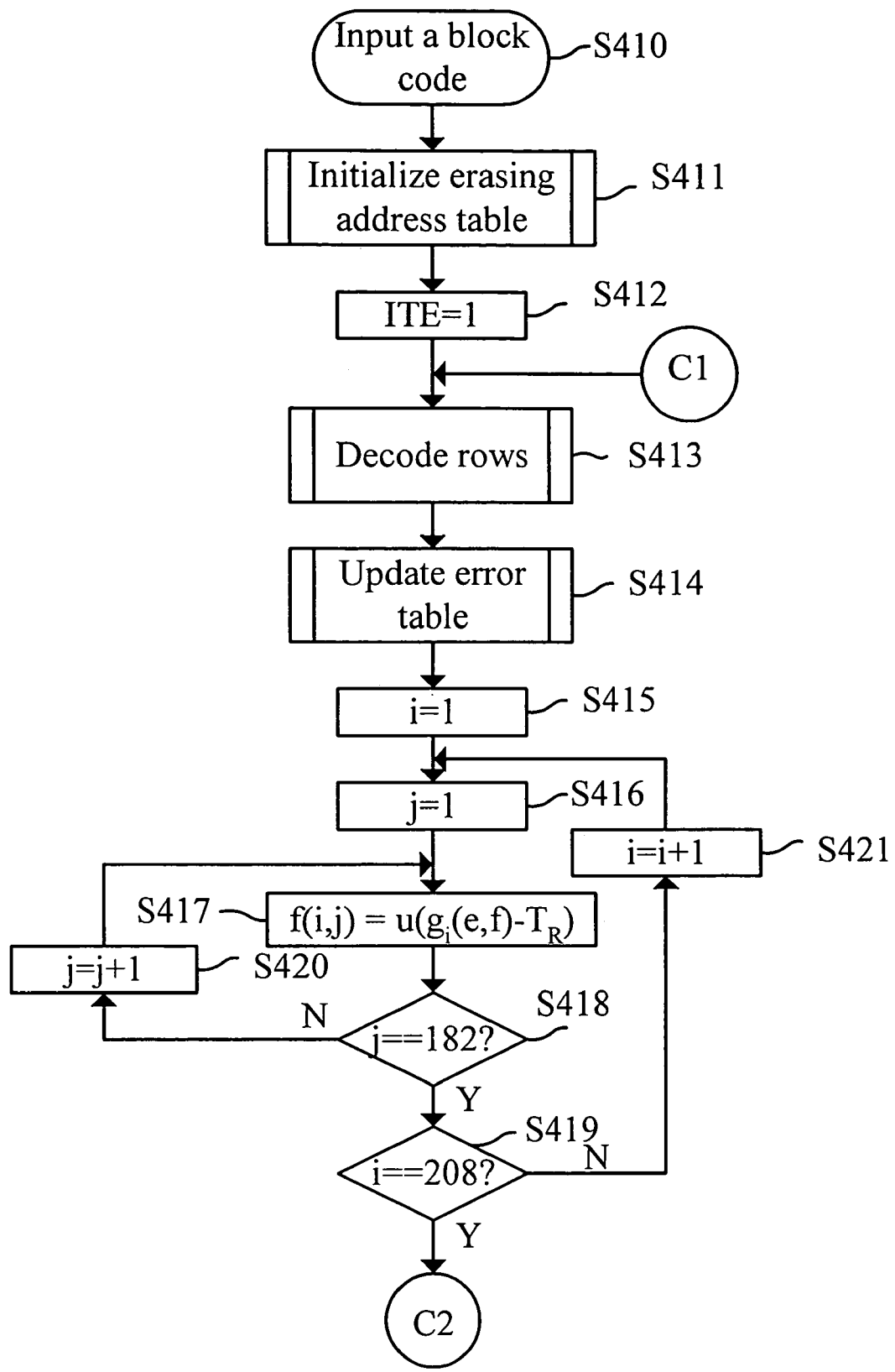
FIGS. 4A and 4B illustrate a flowchart of a method for block code error correction in accordance with the invention.
Figure 4B:
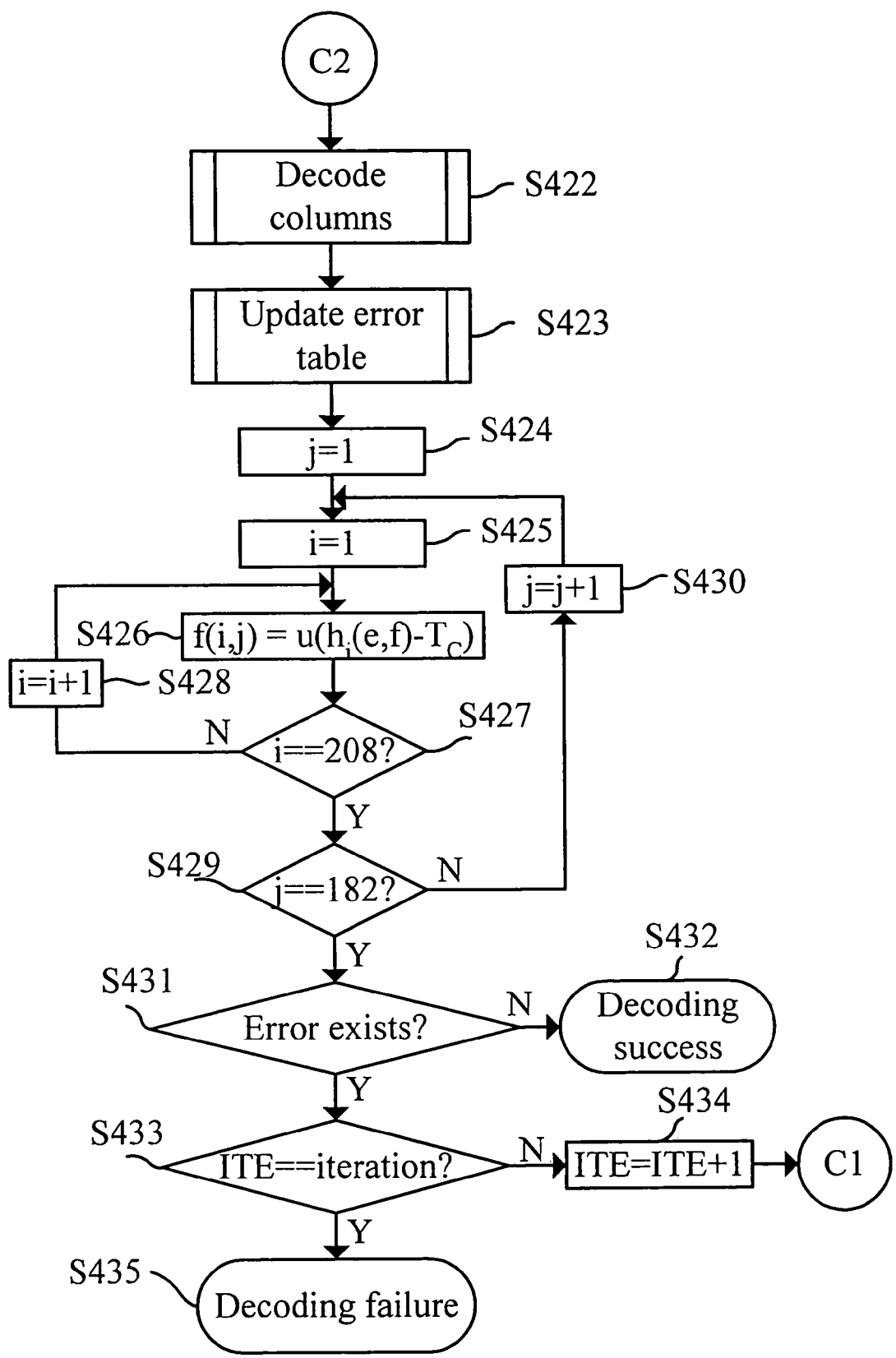

FIGS. 4A and 4B illustrate a flowchart of a method for block code error correction in accordance with the invention. As shown, a block code 311 is inputted in step S410. An erasing address table 320 corresponding to the block code 311 is initialized in step S411. An iteration number (ITE variable) is initialized in step S412. In step S413, the block code 311 is decoded in row direction based on the erasing address table 320 in order to find data errors on rows and accordingly an error table 330 is updated corresponding to the block code 311 in step S414.

In steps S415~S421, the erasing address table 320 is updated in the row direction according to the aforementioned first determination principle $f(i,j)=u(g_i(e,f)-T_R)$, i.e., when $g_i(e,f)$ of i-th row is greater than $T_R$, all erasing entities f(i,j) of the erasing address table 320 corresponding to the i-th row are set as erasing addresses.

In step S422, the block code 311 is decoded in the column direction based on the erasing address table 320 in order to find data errors on columns and accordingly the error table 330 is updated. In steps S424~S430, the erasing address table 320 is updated according to the aforementioned second determination principle $f(i,j)=u(h_j(e,f)-T_C)$; i.e., when $h_j(e,f)$ of j-th column is greater than $T_C$, all erasing entities f(i,j) of the erasing address table 320 corresponding to the j-th column are set as erasing addresses.

In step S431, it determines whether the block code 311 after being decoded still has error or not. If the decoded block code 311 has no error, a success message is generated in step S432. On the other hand, if the decoded block code 311 still has error, it further determines whether the ITE variable's value is greater than a specific value or not (step S433). If yes, a failure message is generated in step S435; otherwise the ITE variable is increased by 1 (step S434) and then the process goes back to step S413.

In view of the foregoing, it is known that the inventive determination principles for updating the erasing address table 320 can vary with decoding results of the decoder and increase of iteration number. Thus, compared to the prior decoder that applies iteration decoding only, the inventive method can obtain a better decoding performance with a less decoding number. In addition, the decoding result, i.e., decoding success or failure, can be determined in a less cycle number, which reduces memory access number. Therefore, power consumption of the decoder and related circuits is reduced.

Although the present invention has been explained in relation to its preferred embodiment, it is to be understood that many other possible modifications and variations can be made without departing from the spirit and scope of the invention as hereinafter claimed.

What is claimed is:

1. A method for block code error correction, the block code including a plurality of data entities in rows and columns and corresponding to an erasing address table and an error table, the erasing address table including a plurality of erasing entities in rows and columns, the error table including a plurality of error entities in rows and columns, the method comprising the steps:

(A) inputting a block code and initializing an erasing address table corresponding to the block code;

(B) decoding the block code in row direction based on the erasing address table in order to find data errors on rows and accordingly update an error table corresponding to the block code;

(C) updating the erasing address table in row direction according to a first determination principle;

(D) decoding the block code in column direction based on the erasing address table in order to find data errors on columns and accordingly update the error table; and (E) updating the erasing address table in column direction according to a second determination principle.

2. The method as claimed in claim 1, wherein steps (B) to (E) are repeated until no error presents or repeat number is over a predetermined value.

3. The method as claimed in claim 2, wherein in step (C), the first determination principle is applied as the following condition: when $g_i(e,f)$ is greater than $T_R$, setting erasing entities of i-th row of the erasing address table as true, where $T_R$ is a first preferred performance parameter, $$g_i(e, f) = 2e(i, :) + f(i, :) = 2\sum_{j=1}^{n} \chi(e(i, j)) + \sum_{j=1}^{n} f(i, j),$$

n is column number of the block code, e(i,j) is value obtained by decoding error entity of i-th row and j-th column of the error table, f(i,j) is value recorded in erasing entity of i-th row and j-th column of the erasing address table, and $$\chi(x) = \begin{cases} 0 & x = 0 \\ 1 & x \neq 0 \end{cases}.$$

4. The method as claimed in claim 3, wherein the first preferred performance parameter $T_R$ has values 6, 9, 10, 10, 10 respectively corresponding to iterative numbers 1, 2, 3, 4, 5 for each repeat from step (B) to step (E).

5. The method as claimed in claim 2, wherein in step (E), the second determination principle is applied as the following condition: when $h_j(e,f)$ is greater than $T_C$, setting erasing entities of j-th column of the erasing address table as true, where $T_C$ is a second preferred performance parameter, $$h_j(e, f) = 2e(:, j) + f(:, j) = 2\sum_{i=1}^{k} \chi(e(i, j)) + \sum_{i=1}^{k} f(i, j),$$

k is row number of the block code, e(i,j) is value obtained by decoding error entity of i-th row and j-th column of the error table, f(i,j) is value recorded in erasing entity of i-th row and j-th column of the erasing address table, and $$\chi(x) = \begin{cases} 0 & x = 0 \\ 1 & x \neq 0 \end{cases}.$$

6. The method as claimed in claim 5, wherein the second preferred performance parameter has values 12, 15, 16, 16, 16 respectively corresponding to iterative numbers 1, 2, 3, 4, 5 for each repeat from step (B) to step (E).

7. A device for block code error correction, the block code including a plurality of data entities in rows and columns, the device comprising:
 a block code input unit, to input a block code;
 an erasing address table having a plurality of erasing entities in rows and columns, wherein the plurality of erasing entities correspond to the plurality of data entities of the block code, respectively;
 an error table having a plurality of error entities in rows and columns, wherein the plurality of error entities correspond to the plurality of data entities of the block code, respectively; and
 a decoder, to decode the block code in a row direction based on the erasing address table for finding data errors on rows and accordingly updating the error table and further updating the erasing address table in the row direction according to a first determination principle, and subsequently decode the block code in a column direction based on the erasing address table for finding data errors on columns and accordingly updating the error table and further updating the erasing address table in the column direction according to a second determination principle.

8. The device as claimed in claim 7, wherein the decoder decodes the block code for a plurality of times until no error presents or the decoding number is over a predetermined value.

9. The device as claimed in claim 8, wherein the first determination principle is applied as the following condition: when $g_i(e,f)$ is greater than $T_R$, setting erasing entities of i-th row of the erasing address table as true, where $T_R$ is a first preferred performance parameter, $$g_i(e, f) = 2e(i, :) + f(i, :) = 2\sum_{j=1}^{n} \chi(e(i, j)) + \sum_{j=1}^{n} f(i, j),$$

n is column number of the block code, e(i,j) is value obtained by decoding error entity of i-th row and j-th column of the error table, f(i,j) is value recorded in erasing entity of i-th row and j-th column of the erasing address table, and $$\chi(x) = \begin{cases} 0 & x = 0 \\ 1 & x \neq 0 \end{cases}.$$

10. The device as claimed in claim 9, wherein the first preferred performance parameter has values 6, 9, 10, 10, 10 respectively corresponding to iterative numbers 1, 2, 3, 4, 5 for each repeat from step (B) to step (E).

11. The device as claimed in claim 9, wherein the second determination principle is applied as the following condition: when $h_j(e,f)$ is greater than $T_C$, setting erasing entities of j-th column of the erasing address table as true, where $T_C$ is a second preferred performance parameter, $$h_j(e, f) = 2e(:, j) + f(:, j) = 2\sum_{i=1}^{k} \chi(e(i, j)) + \sum_{i=1}^{k} f(i, j),$$

k is row number of the block code, e(i,j) is value obtained by decoding error entity of i-th row and j-th column of the error table, f(i,j) is value recorded in erasing entity of i-th row and j-th column of the erasing address table, and $$\chi(x) = \begin{cases} 0 & x = 0 \\ 1 & x \neq 0 \end{cases}.$$

12. The device as claimed in claim 11, wherein the second preferred performance parameter has values 12, 15, 16, 16, 16 respectively corresponding to iterative numbers 1, 2, 3, 4, 5, for each repeat from step (B) to step (E).

* * * * *